United States Patent [19]
Jenn-Gwo et al.

[11] Patent Number: 5,616,233
[45] Date of Patent: Apr. 1, 1997

[54] METHOD FOR MAKING A FLUORINATED SILICON DIOXIDE LAYER ON SILICON SUBSTRATE BY ANODIC OXIDATION AT ROOM TEMPERATURE

[75] Inventors: Hwu Jenn-Gwo; Jeng Ming-Jer, both of Taipei, Taiwan

[73] Assignee: National Science Council, Taipei, Taiwan

[21] Appl. No.: 640,476

[22] Filed: May 1, 1996

[51] Int. Cl.$^6$ ............................. C25D 7/12; C25D 11/32
[52] U.S. Cl. ......................... 205/157; 205/316; 205/333
[58] Field of Search ................................. 205/157, 316, 205/333

[56] References Cited

FOREIGN PATENT DOCUMENTS 2952157  6/1981  Germany ................. 205/333
1008296  1/1989  Japan .

*Primary Examiner*—Arun S. Phasge
*Attorney, Agent, or Firm*—Hitt Chwang & Gaines, P.C.

[57] ABSTRACT

A method for forming a fluorinated silicon dioxide layer on a silicon substrate is brought about by anodic oxidation at room temperature. The fluorinated silicon dioxide layer may serve as a field oxide layer or the oxide layer of a thin film transistor. The method involves an electrolytic reaction making use of the silicon substrate as an anode and an electrolyte made of a hydrosilicofluoric acid aqueous solution containing the hydrosilicofluoric acid and the water in a volumetric ratio of about 1:1000. The electrolytic reaction is brought about by a current density of about 1 mA/cm$^2$. The oxide layer is formed on the anode at a rate of 1 µm/hr and is proved to contain a Si-F bond by the FTIR analysis.

6 Claims, 6 Drawing Sheets

5,616,233

METHOD FOR MAKING A FLUORINATED SILICON DIOXIDE LAYER ON SILICON SUBSTRATE BY ANODIC OXIDATION AT ROOM TEMPERATURE

FIELD OF THE INVENTION

The present invention relates generally to a method for making a silicon dioxide layer on a silicon substrate, and more particularly to a method for forming a fluorinated silicon dioxide layer on a silicon substrate by anodic oxidation at room temperature.

BACKGROUND OF THE INVENTION

The current methods for forming a silicon dioxide layer in the fabrication of an integrated circuit include mainly the thermal oxidation, the chemical vapor deposition (CVD), the plasma enhanced chemical vapor deposition (PECVD), and the liquid phase deposition (LPD). The thermal oxidation must be carried out at a high temperature and is a time-consuming process. The shortcomings of the thermal oxidation can be overcome by the methods of CVD, PECVD and LPD. However, the methods of CVD, PECVD and LPD have their own share of problems in that they are also time-consuming, and that they are incapable of forming an oxide layer of an uniform thickness.

SUMMARY OF THE INVENTION

The primary objective of the present invention is therefore to provide a method for forming a silicon dioxide layer, which is devoid of the deficiencies of the prior art methods described above. In other words, the method of the present invention is time-saving and capable of forming an oxide layer of an uniform thickness at a relatively low temperature (room temperature). In addition, the method of the present invention is capable of forming a fluorinated silicon dioxide layer which is superior in characteristic to the silicon dioxide layer.

In keeping with the principle of the present invention, the foregoing primary objective of the present invention is attained by a method, which comprises conducting an electrolytic reaction at room temperature so as to form a silicon dioxide layer on a silicon substrate acting as an anode in the electrolytic reaction. An hydrosilicofluoric acid aqueous solution is used as the electrolyte. The hydrosilicofluoric acid aqueous solution contains hydrosilicofluoric acid and water in a volumetric ratio ranging between 1:10 and 1:2000, preferably 1:1000. The electrolytic reaction is carried out with an current density ranging between 0.05 and 100 mA/cm$^2$, preferably 1 mA/cm$^2$.

It must be noted here that any metal, such as platinum, which does not react with the hydrosilicofluoric aqueous solution, may be used as a cathode of the electrolytic reaction of the method of the present invention.

When the electrolytic reaction of the method of the present invention is under way, most of the silicon substrate is submerged in the electrolyte. In the meantime, on one surface of the unsubmerged portion of the silicon substrate is coated with a metal by vapor deposition for use as the ohmic contact of the anode and is connected with the positive terminal of an external power source of direct current.

DETAILED DESCRIPTION OF THE EMBODIMENTS

Figure 1:
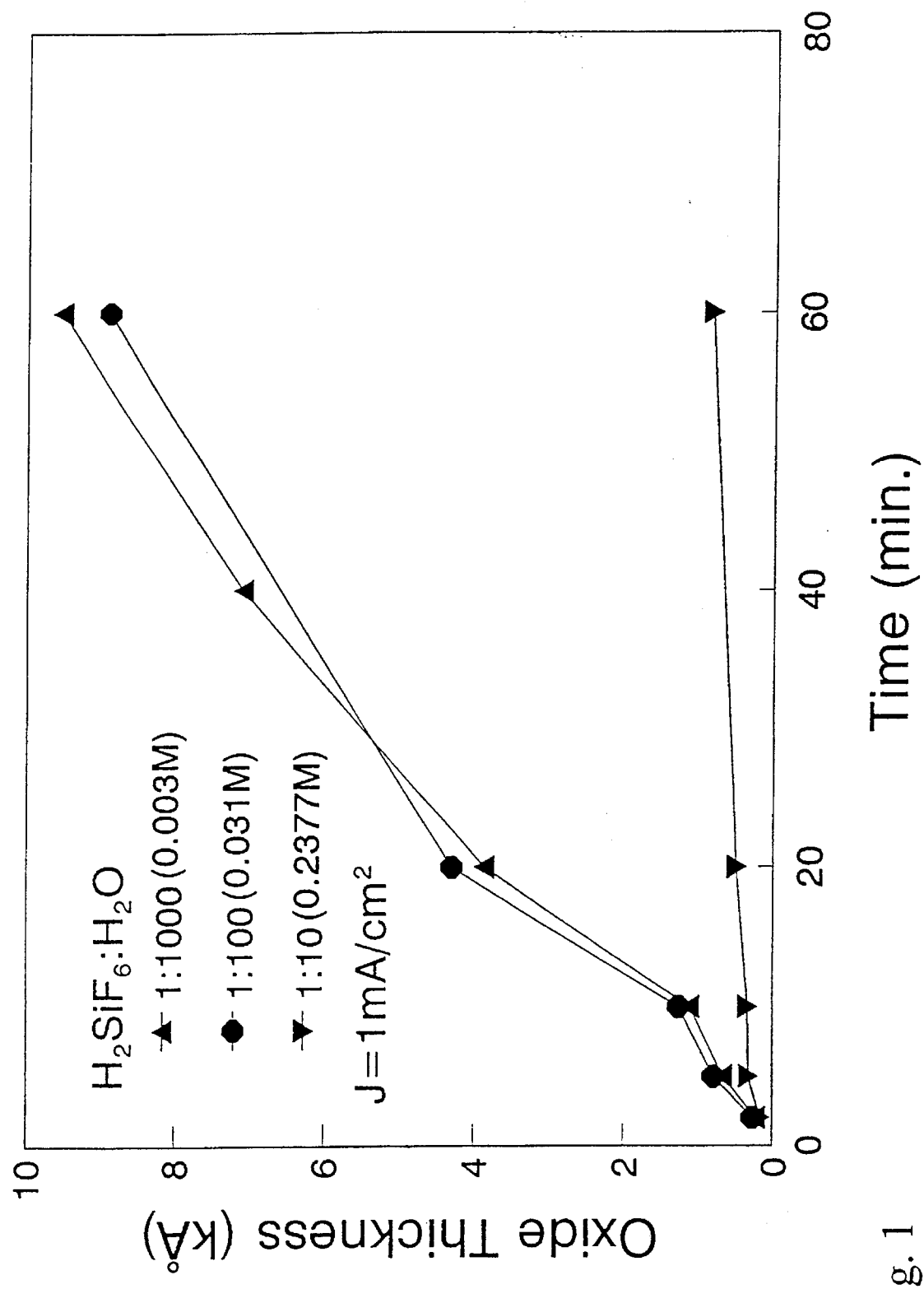
FIG. 1 is a plot which shows the relationship between the concentration of the hydrosilicofluoric acid and the formation rate of the silicon dioxide layer, in which curves of -▲-, -●-, and -▼- designates respectively the volumetric ratios of the hydrosilicofluoric acid: water =1:1000 (0.003M), 1:100 (0.031M) and 1:10 (0.2377M).

The method of the present invention involves the formation of a fluorinated silicon dioxide layer on a silicon chip by the anodic oxidation which is brought about by undergoing an electrolytic reaction at room temperature with a constant electric current and a diluted hydrosilicofluoric acid aqueous solution acting as the electrolyte.

The method of the present invention is brought about at a relatively low temperature (room temperature) and is therefore capable of prevention of the crack and the impurity-redistribution effect of the silicon chip. In addition, the silicon dioxide layer formed by the anodic oxidation of the method of the present invention has an even thickness in view of the fact that the silicon dioxide layer so formed is capable of the self-filling of the voids. Moreover, the silicon dioxide layer formed by the method of the present invention is fluorinated so that the formation of the silicon dioxide layer is accelerated, and that the abilities of the fluorinated silicon dioxide layer of the present invention for resisting the thermal electron and the radiation damage are enhanced, and thus the breakdown of the oxide layer is substantially improved, as compared with the silicon dioxide layers formed by the prior art methods. The method of the present invention can be applied in the fabrication of an integrated circuit for forming a field oxide layer or the oxide layer of a thin film transistor. Furthermore, as compared with the well-publicized room temperature LPD method, the method of the present invention is superior in design in that it is capable of forming the oxide layer at a relatively faster rate, and that the oxide layer so formed is uniform in thickness.

When the electrolytic reaction of the method of the present invention is under way, most of the silicon chip is submerged in the electrolyte. In the meantime, the unsubmerged portion of the silicon chip is coated with a metal by the vapor deposition for use as the ohmic contact of the anode and is connected with the positive terminal of an external power source of direct current.

A first preferred embodiment of the present invention was intended to show the relationship between the formation rate of the silicon dioxide layer and the hydrosilicofluoric acid concentration.

The first preferred embodiment of the present invention was provided with a silicon chip of P-type 100 orientation and having a resistivity ranging between 1 and 10 $\Omega$-cm. The silicon chip was rinsed in accordance with the RCA standard procedures before the surface of the upper portion of the silicon chip was coated by the vapor deposition an aluminum film for use as the ohmic contact of the anode and was connected with the positive terminal of an external direct-current power source having a constant current. The uncoated portion of the silicon chip was submerged in a diluted hydrosilicofluoric acid aqueous solution acting as the electrolyte. A platinum thin piece was used as the cathode having one end that was submerged in the electrolyte and having another end which was connected with the negative terminal of the direct current power source.

The first preferred embodiment of the present invention was intended to study the influence of the hydrosilicofluoric acid concentration on the growth of the silicon dioxide on the anode of the electrolytic reaction in which the electrolytes having various concentrations of the hydrosilicofluoric acid were employed and a constant current density (J) of 1 mA/cm$^2$ was used. The results are shown respectively in FIG. 1 and Table 1. The thickness and the refractive index of the silicon dioxide layers so formed were measured by an ellipsometer.

As shown in FIG. 1, the growth of the silicon dioxide layer is the fastest when the concentration of the hexafluorosilicic acid is lowest. For example, when the volumetric ratio of the hydrosilicofluoric acid and water was kept at 1:1000, the growth rate of the silicon dioxide layer was about 1 μm/hr, which is significantly higher than 0.2 μm/hr of the growth rate of the silicon dioxide layer formed by the LPD method. It was further observed by these inventors of the present invention in an experiment, in which pure water was used as the electrolyte containing no hexafluorosilicic acid, that the growth of the silicon dioxide layer was found to be exceedingly slow.

TABLE 1

| | Hexafluorosilicic acid concentration [hexafluorosilicic acid:water (volumetric ratio)] | | |
|---|---|---|---|
| | 1:10 | 1:100 | 1:1000 |
| uniformity | 1.8% | 3.4% | 3.7% |
| refractive index | 1.4 | 1.36 | 1.36 |

The data presented in Table 1 were obtained by measuring the silicon dioxide layers having an area of 1 square inch at the growth time of 20 minutes. On the basis of the data of Table 1, the silicon dioxide layers formed by the method of the present invention have a thickness uniformity lower than 4% and a refractive index slightly lower than 1.46 of the silicon dioxide layer formed by the thermal oxidation method.

A second preferred embodiment of the present invention was carried out to study the influence of the current density (J) on the growth rate of the silicon dioxide layer. The second preferred embodiment of the present invention was basically similar to the first preferred embodiment of the present invention, except that the former made use of the electrolyte having a constant volumetric concentration (1:10) of the hexafluorosilicic acid aqueous solution, and that the former made use of various current densities.

Figure 2:
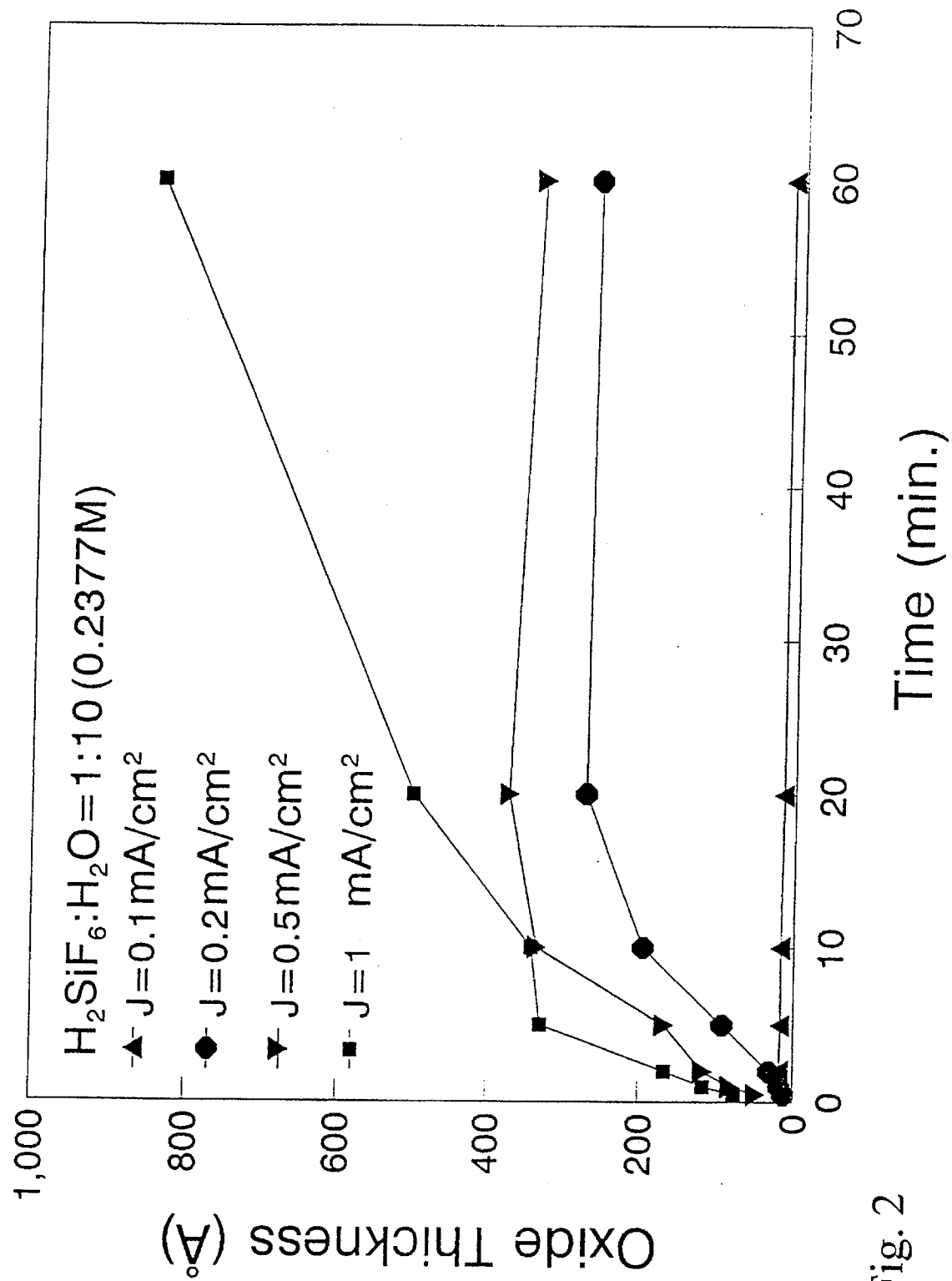
FIG. 2 is a plot which shows the relationship between the current density (J) and the formation rate of the silicon dioxide layer, in which curves of -▲-, -●-, -▼-, and -■- represents respectively the current densities (J) of J=0.1 mA/cm$^2$, J=0.2 mA/cm$^2$, J=0.5 mA/cm$^2$ and J=1 mA/cm$^2$.

The results of the second preferred embodiment of the present invention are shown in FIG. 2. The growth of the silicon dioxide layers becomes faster as the current density (J) of the electrolyte becomes greater. The growth of the silicon dioxide is almost nonexistent when the current density (J) remains at 0.1 mA/cm$^2$. This is due to the fact that the growth of the silicon dioxide is canceled out by the etching of the silicon dioxide when the current density (J) is kept at 0.1 mA/cm$^2$. The etching of the silicon dioxide is brought about by hydrofluoric acid which is formed by the hexafluorosilicic acid reacting with water. It is therefore readily apparent that the growth of the silicon dioxide is impossible when the growth rate of the silicon dioxide is lower than the rate of the etching of the silicon dioxide.

Figure 3:
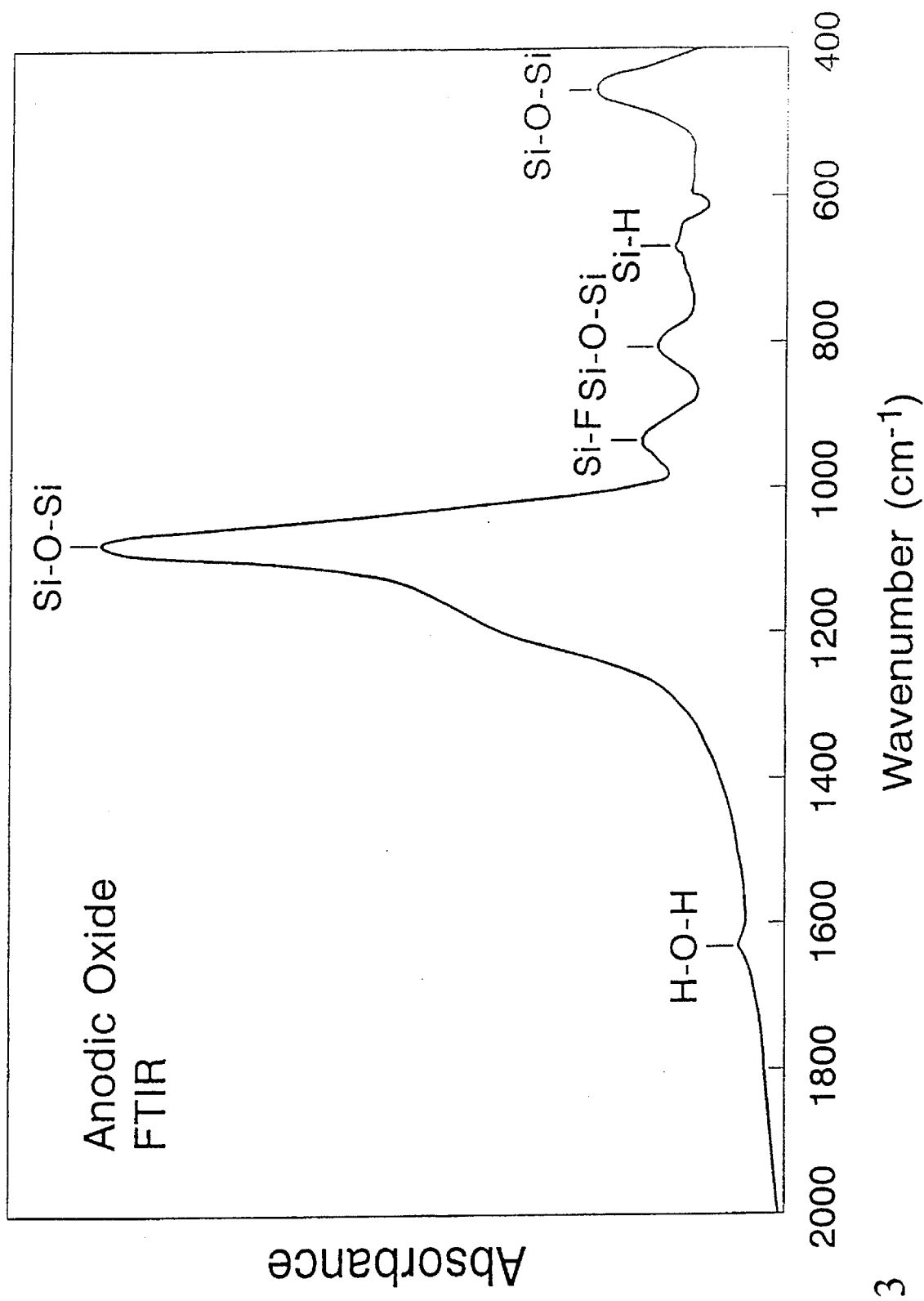
FIG. 3 shows a Fourier transform infrared spectrum (FTIR) of the silicon dioxide layer formed by the method of the present invention.

FIG. 3 shows a FTIR of the silicon dioxide layers formed by using an electrolyte containing the volumetric ratio of the hydrosilicofluoric acid to water equal to 1:1000 and the current density (J) of 1 mA/cm$^2$. The peaks are similar to that of the ordinary silicon dioxide layers. In addition, there is a peak at 934 cm$^{-1}$ representing the Si-F bond. It is known that the silicon dioxide layer containing an appropriate amount of Si-F bond has an improved characteristic.

A third preferred embodiment of the present invention was intended to study the characteristic of the MOS capacitor prepared by using the silicon dioxide layer grown by the present method. The third preferred embodiment of the present invention was carried out in accordance with the first preferred embodiment of the present invention, except that the current density of the former was kept at 1 mA/cm$^2$, and that volumetric ratio of hydrosilicofluoric acid to water of the former was 1:10.

The third preferred embodiment of the present invention involved forming on one surface of a silicon wafer a silicon dioxide layer having a thickness of 95 angstroms. The formation of the silicon dioxide layer was brought about by an electrolytic reaction lasting 8 minutes. The silicon dioxide layer so formed was then coated by deposition with an aluminum layer before forming the aluminum electrodes having various areas by lithography. Thereafter, the opposite surface of the silicon wafer was coated by deposition with an aluminum layer serving as another electrode. The device so made was an MOS capacitor.

Figure 4:
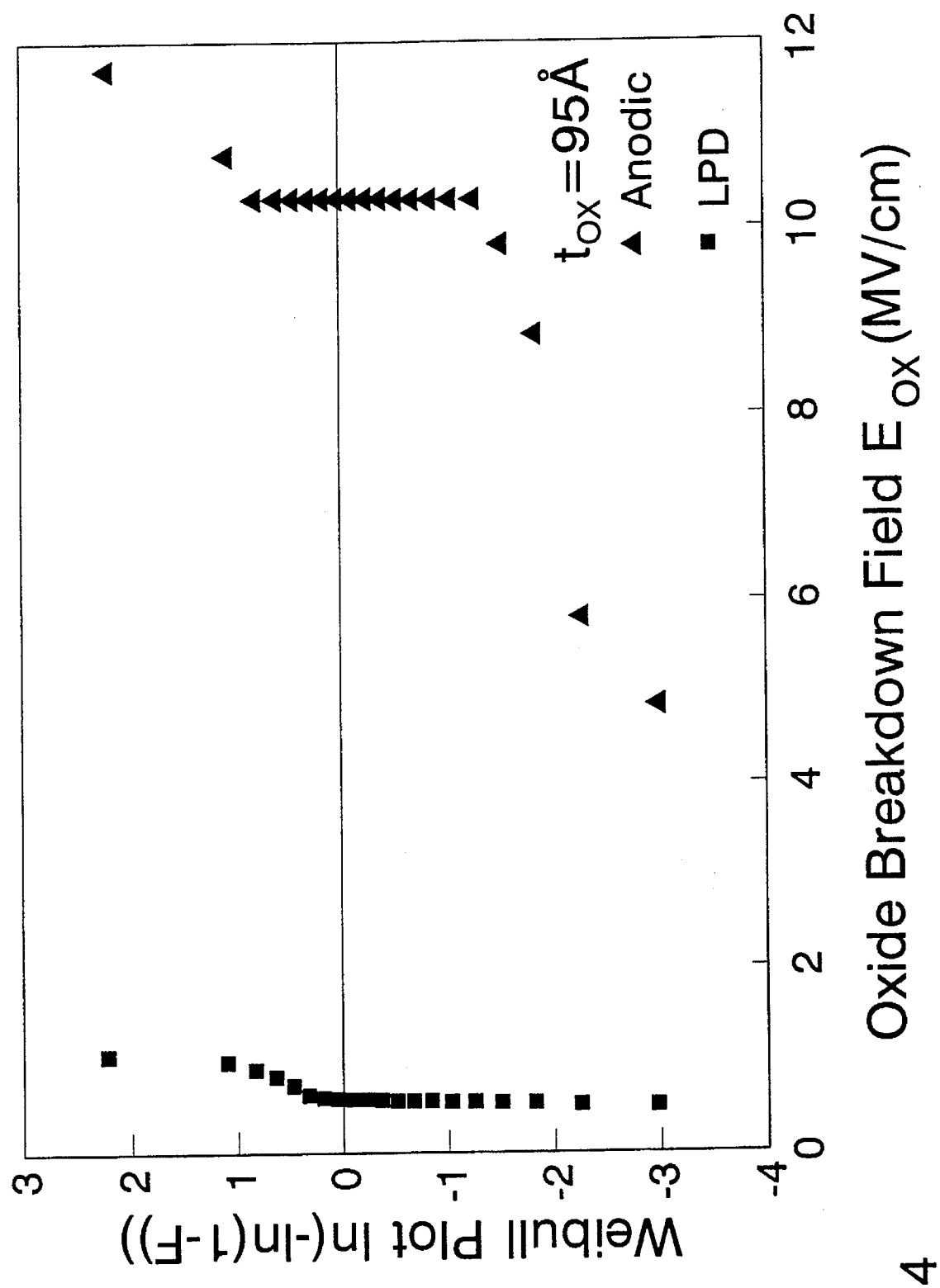
FIG. 4 is a Weibull plot illustrating the time-zero dielectric breakdown (TZDB) characteristics of the MOS capacitors made respectively by using the silicon dioxide layers formed respectively by the method of the present invention and the LPD method as the dielectric layers, with the silicon dioxide layers having a thickness ($T_{ox}$) of about 95 angstroms.

FIG. 4 shows the time-zero dielectric breakdown (TZDB) of the MOS capacitors made respectively by the method of the present invention and the LPD method. Both MOS capacitors comprise respectively a silicon dioxide layer having the thickness ($T_{ox}$) of 95 angstroms or so. A stepped voltage was applied to the oxide layer having a gate area of $1.767 \times 10^{-4}$ cm$^2$ such that the stepped voltage was increased 0.5 volt every second. When the gate current reached $1 \times 10^{-6}$A, the voltage was said to be a breakdown voltage. It is shown in FIG. 4 that the oxide layer of the MOS capacitor made by the third preferred embodiment of the present invention has a breakdown electric field of 10 MV/cm, which is much greater than the breakdown electric field of the oxide layer made by the LPD method.

Figure 5:
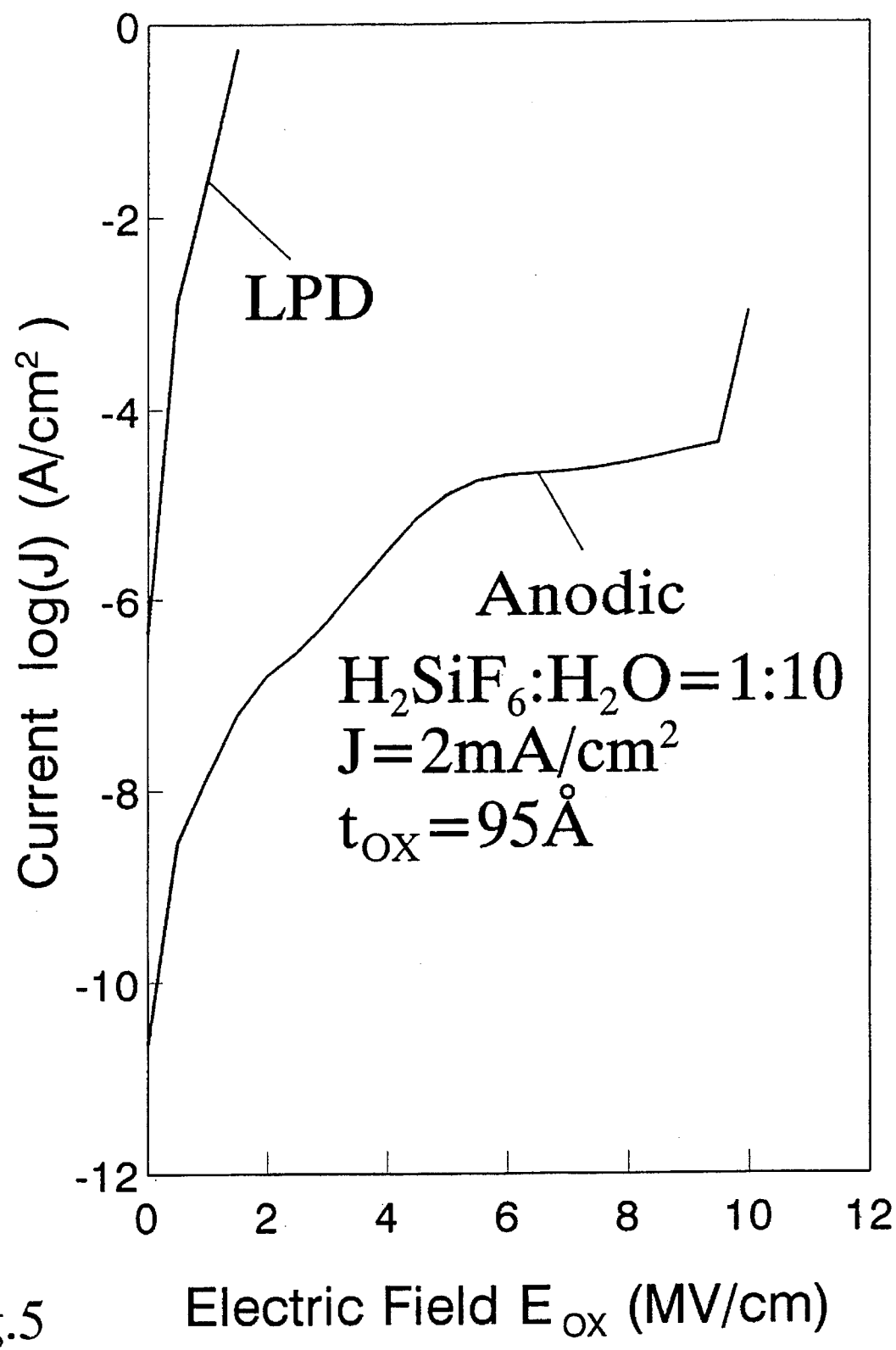
FIG. 5 shows two curves illustrating the current-voltage characteristics of the MOS capacitor made by using the silicon dioxide layer formed by the method of the present invention as the dielectric layer and the MOS capacitor made by using the silicon dioxide layer formed by the LPD method as the dielectric layer with both the silicon dioxide layers having a thickness ($T_{ox}$) of about 95 angstroms.

FIG. 5 shows two current-voltage characteristic curves of the MOS capacitors comprising the silicon dioxide layers made respectively by the method of the present invention and the LPD method. The silicon dioxide layers have a thickness ($T_{ox}$) of 95 angstroms or so. It is readily apparent that the MOS capacitor made by the method of the present invention has a lower leakage current.

Figure 6:
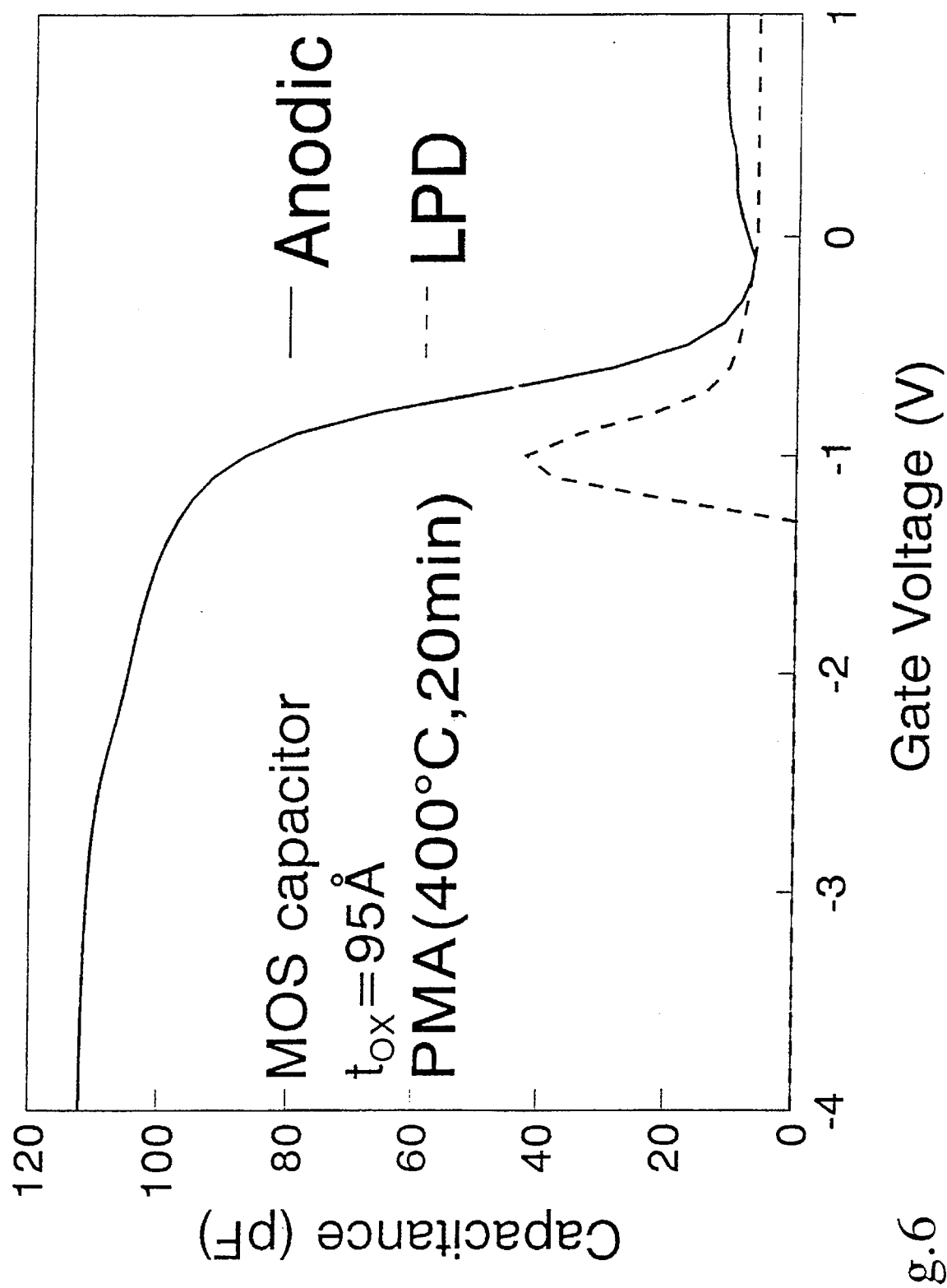
FIG. 6 shows two curves illustrating the high frequency capacitance-voltage characteristics of the MOS capacitor made by using the silicon dioxide layer formed by the method of the present invention as the dielectric layer and the MOS capacitor made by using the silicon dioxide layer formed by the LPD method as the dielectric layer, with both silicon dioxide layers having a thickness ($T_{ox}$) of about 95 angstroms.

FIG. 6 shows two high frequency capacitance-voltage curves of the MOS capacitors comprising the silicon dioxide layers made respectively by the method of the present invention and the LPD method. The silicon dioxide layers have a thickness ($T_{ox}$) of 95 angstroms or so. The MOS capacitors were subjected to a post metal annealing treatment (PMA) at 400° C. for 20 minutes. The capacitance-voltage curve of MOS made by the LPD method was seriously distorted by the leakage current of the silicon dioxide layer. On the other hand, the capacitance-voltage curve of the MOS capacitor made by the method of the present invention was not bad, which shows a flat energy band voltage of about −0.65 V. This indicates that the silicon dioxide layer formed by the anodic oxidation contains negative charge ions, which may be —OH.

The embodiments of the present invention describe above are to be regarded in all respects as being illustrative and not restrictive. Accordingly, the present invention may be embodied in other specific forms without deviating from the spirit thereof. The present invention is therefore to be limited only by the scopes of the following appended claims.

What is claimed is:

1. A method for forming a fluorinated silicon dioxide layer on a silicon substrate by anodic oxidation at room temperature, said method comprising conducting an electrolytic reaction at a room temperature such that a silicon dioxide layer is formed on a silicon substrate acting as an anode, in which a hydrosilicofluoric acid solution consisting essentially of hexafluorosilicic acid and water in a volumetric ratio ranging between 1:10 and 1:2000 is used as an electrolyte, and said electrolytic reaction is carded out with a current density ranging between 0.05 and 100 mA/cm$^2$.

2. The method as defined in claim 1, wherein said hydrosilicofluoric acid solution consists essentially of said hexafluorosilicic acid and said water in a volumetric ratio of 1:1000.

3. The method as defined in claim 1, wherein said current density is 1 mA/cm$^2$.

4. The method as defined in claim 1, wherein said electrolytic reaction is provided with a cathode of a metal substantially inactive with said hydrosilicofluoric acid solution consisting essentially of said hexafluorosilicic add and said water.

5. The method as defined in claim 4, wherein said metal is platinum.

6. The method as defined in claim 1, wherein most of said silicon substrate is submerged in said electrolyte, an unsubmerged portion of said silicon substrate is coated by deposition with a metal film acting as an ohmic contact of said anode, and said metal film is connected with a positive terminal of an external power source of direct current.

\* \* \* \* \*